United States Patent
Capriz

[19]

[11] Patent Number: 5,991,151
[45] Date of Patent: Nov. 23, 1999

[54] HEAT SINK, IN PARTICULAR FOR ELECTRONIC COMPONENTS

[75] Inventor: Cesare Capriz, Castello d'Argile, Italy

[73] Assignee: EL.BO.MEC. S.r.l., Bologna, Italy

[21] Appl. No.: 09/081,623

[22] Filed: May 19, 1998

[30] Foreign Application Priority Data

May 30, 1997  [IT]  Italy ................................. BO97A0325

[51] Int. Cl.⁶ .................................................... H05K 7/20
[52] U.S. Cl. .......................... 361/704; 361/707; 361/709; 361/710; 361/719; 257/718; 257/719; 257/727; 165/80.3; 165/185; 174/16.3
[58] Field of Search ..................................... 361/704, 690, 361/707–711, 715–722, 807–811; 165/80.1–80.3, 185; 257/706, 707, 712, 713, 718, 719, 726, 727; 174/16.3

[56] References Cited

U.S. PATENT DOCUMENTS

| | | | |
|---|---|---|---|
| 4,638,404 | 1/1987 | Grossmann et al. | 361/710 |
| 4,707,726 | 11/1987 | Tinder | 165/80.1 |
| 4,891,735 | 1/1990 | Mikoljczak | 361/704 |
| 4,961,125 | 10/1990 | Jordan et al. | 165/80.3 |
| 5,040,096 | 8/1991 | Churchill et al. | 361/704 |
| 5,068,764 | 11/1991 | Bland et al. | |
| 5,077,638 | 12/1991 | Andersson et al. | 361/710 |
| 5,343,362 | 8/1994 | Solberg | 361/710 |
| 5,373,099 | 12/1994 | Boitard et al. | 361/709 |
| 5,466,970 | 11/1995 | Smithers | 257/712 |

FOREIGN PATENT DOCUMENTS

| | | |
|---|---|---|
| 622983 | 11/1994 | European Pat. Off. . |
| 86 06 346 | 6/1986 | Germany . |
| 2184887 | 7/1987 | United Kingdom . |

*Primary Examiner*—Donald Sparks
*Assistant Examiner*—Boris L. Chervinsky
*Attorney, Agent, or Firm*—Fay, Sharpe, Fagan, Minnich & McKee, LLP

[57] ABSTRACT

A heat sink (2) for electronic components (1) comprises: a base portion (3) fitted with device (4) for coupling with a fixed support plane (5) of an apparatus; a plane surface (6), positioned in proximity to the base portion (3), in contact with a corresponding surface (7) of the electronic component (1), and an additional heat dissipation portion (8) comprising a prolongation (9) of the base portion (3) from which extend a plurality of fins (10); an elastically yielding element (11) acts between the heat sink (2) and the electronic component (1) to obtain a stable positioning of the surface (7) of the component itself to the related plane surface (6) of the heat sink (2); a pair of fins (10a, 10b), contiguous to each other, presents a respective inner wall (12, 13), sush walls being opposite one to the other and so shaped as to define a compartment (14) for stably housing a portion (15) of the elastically yielding element (11).

5 Claims, 2 Drawing Sheets

HEAT SINK, IN PARTICULAR FOR ELECTRONIC COMPONENTS

BACKGROUND OF THE INVENTION

The present invention relates to a heat sink, in particular for use with electronic components.

At present, electronic components and the related circuits have reached high levels of operating reliability and precision, so much so that they are used in the most disparate technological fields both as major components (see the common Personal Computers), and to integrate and support apparatuses ranging from control systems for welding machines, to command and control systems for automated machines, to regulating systems for the proper operation of engines, etc.

Usually such electronic circuits essentially comprise a mother board whereon are pre-printed connecting circuits for pluralities of electronic components, which are arranged or in turn connected to the mother board, with the whole set enclosed in a chassis.

In combination with one or more of such components—which we usually define as processors—a related heat sink is used which allows to dissipate the heat generated by the steady state operation of the components themselves which, as is well known, require controlled operating temperatures. Such heat sinks generally comprise a first portion destined to be in contact with the related electronic component and a second portion shaped to present a plurality of fins able to favour better heat dissipation.

To couple the electronic component and the heat sink in such a way as to allow for an optimal contact of the related surfaces, various solutions are currently in existence, studied also according to the internal structure (mother board and component) and to the external structure (chassis) of the apparatuses.

Currently, the most widely employed provide for the use of an elastic element acting on the electronic component to press it against the first portion of the heat sink: the patent EP-622.983 shows one of these solutions, where the elastic element holding the electronic component comprises a metal platelet fastened, at one of its ends, to a wall of the chassis by means of a screw, whilst the development of the platelet is such that one of its portions is in contact with the electronic component which in turn is stably interposed between the platelet itself and the appropriate surface of the first portion of the heat sink.

Another known solution is to apply the elastic holding element (in practice a spring) directly onto the aforesaid first portion of the heat sink: in this case a recess or a seat is obtained on the upper part of the first portion, wherein is stably fastened one end of the elastic element; the latter is shaped in such a way as to present its active portion in contact with the component opposite to the lower part of the first portion of the heat sink.

The first of the solutions described above presents the drawback stemming from the mounting complexity due to the need to fasten the elastic platelet with a screw which cannot always be positioned close to the component and to the heat sink, making it necessary to apply platelets which are long, bulky, and not always reliable in holding the component, in addition to requiring fastening operations which are not always easy to perform in structures of extremely reduced size.

The second solution described presents a reduced size of the dissipator—holding spring—component set with respect to the previous solution, but its clasping system is not very reliable and mounting the spring on the dissipator is awkward; moreover, the first portion of the heat sink has to be enlarged in order to obtain the seat for fastening the spring, thus decreasing the useful surface area for heat dissipation.

SUMMARY OF THE INVENTION

The object of the present invention therefore is to eliminate the drawbacks mentioned above through the realisation of a heat sink for electronic components presenting a structure of reduced size, with rapid fastening of the electronic component and of the retaining spring of the latter, whilst maintaining a large surface area for heat dissipation.

BRIEF DESCRIPTION OF THE DRAWINGS

The technical characteristics of the invention, according to the aforesaid purposes, can clearly be seen from the content of the claims reported below and its advantages shall be made more evident in the detailed description that follows, made with reference to the attached drawings, which show an embodiment provided purely by way of non limiting example, wherein:

DESCRIPTION OF THE PREFERRED EMBODIMENTS

Figure 1:
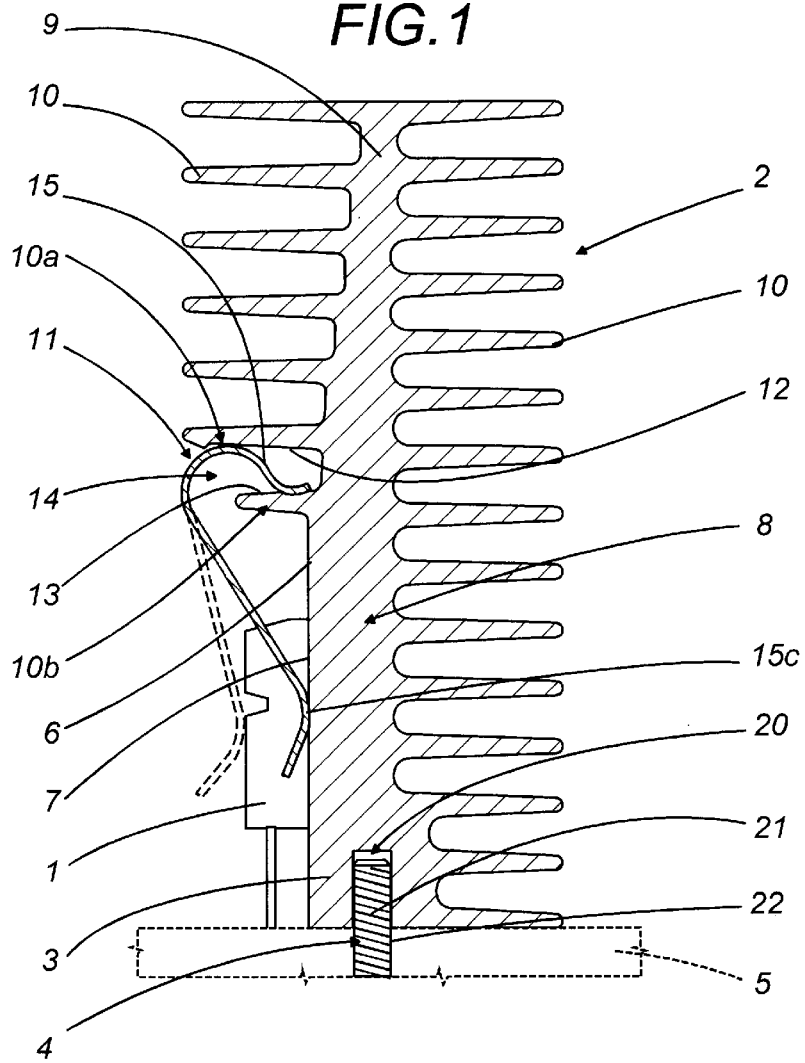
FIG. 1 shows a first heat sink for electronic components according to the present invention and applied to a mother board of an electronic apparatus, the figure being a front view with some parts shown in section and some removed the better to highlight some details.
Figure 5:
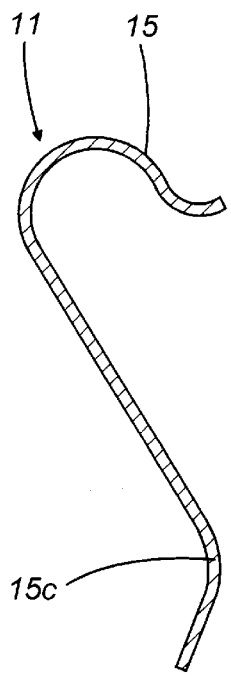
FIG. 5 shows a front view of an additional elastic element, in enlarged scale, which is part of the heat sink as per FIGS. 1 and 2.
Figure 3:
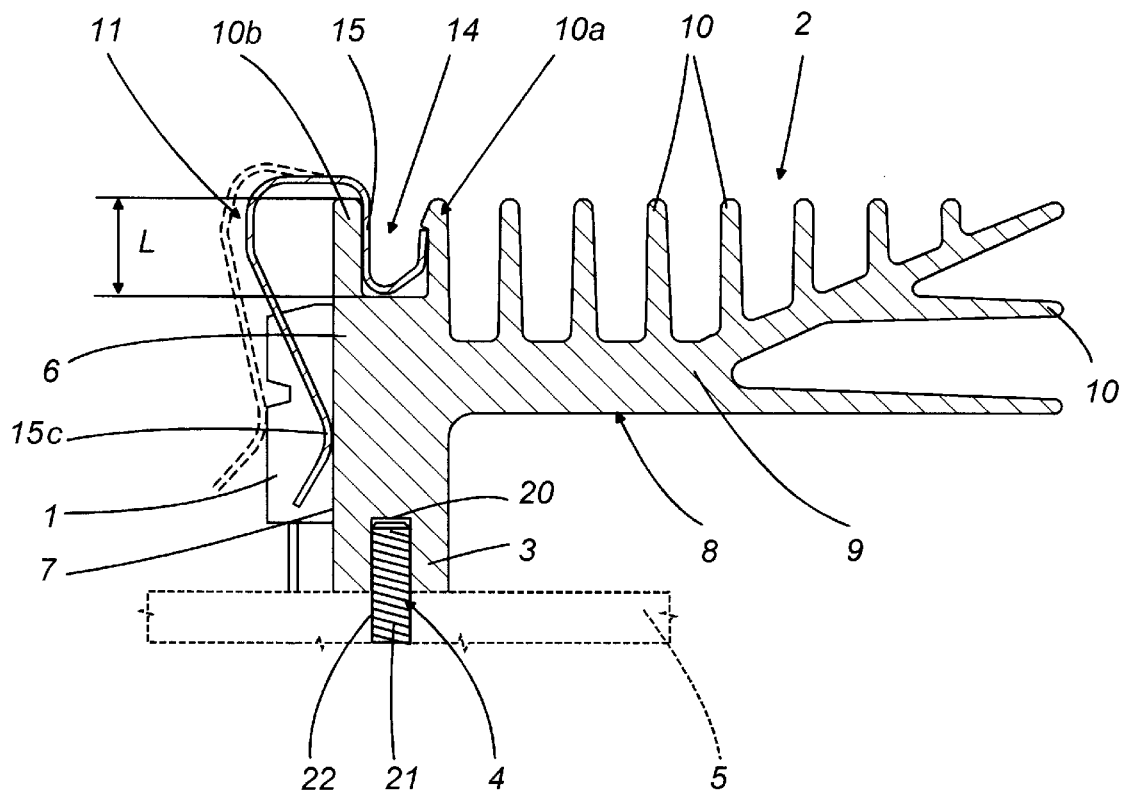
FIG. 3 shows a second heat sink for electronic components according to the present invention, the figure being a front view with some parts shown in section the better to highlight other parts.
Figure 4:
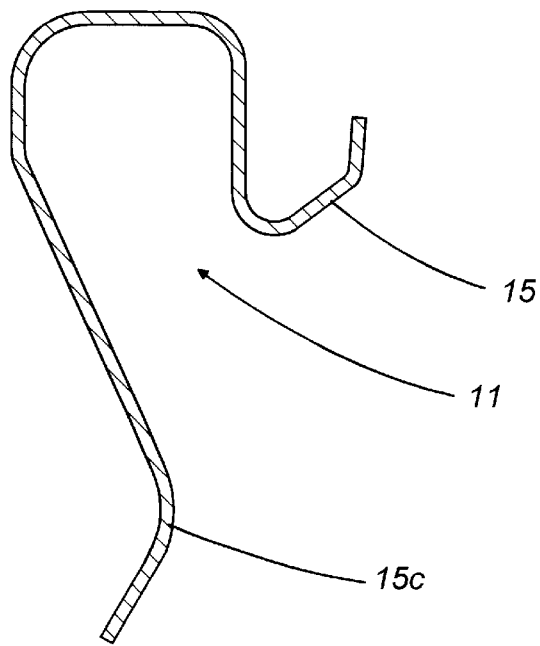
FIG. 4 shows a front view of an elastic element, in enlarged scale, which is part of the heat sink as per FIG. 3.

In accordance with the figures of the enclosed drawings, and with particular reference to FIGS. 1 and 3, a heat sink such as the subject one is usable to cool electronic components 1 (shown only schematically here, as they are known in the art and are not strictly part of the invention).

The heat sink, indicated in its entirety as 2, comprises a base portion 3 provided with means 4 for coupling with a fixed support plane 5 of an apparatus: in practice, the base portion 3 is provided with a threaded seat 20 inside which is screwingly engaged an appropriate screw 21 passing within a hole 22 obtained on plane 5 which in practice is a mother board of the apparatus (here the mother board is only partially shown, as it is known in the art and is not part of the subject invention).

The base portion 3 is provided with a plane surface 6 in contact with a corresponding surface 7 of the aforesaid electronic component 1 and with an additional portion 8 for heat dissipation constituted by an actual prolongation 9 of the base portion 3: in FIGS. 1 and 3, such prolongations 9 can develop from the base portion 3 vertically, with respect to the mother board 5, or horizontally or in any other direction depending on the size of the components of the apparatus wherein they are to be inserted.

From this prolongation 9 extend, from one or from opposite bands of the prolongation itself, a plurality of fins 10 parallel one to the other (or even inclined with respect to prolongation 9) and able to allow the dissipation of the heat generated by the electronic component 1.

The latter is positioned and held against the surface 6 of the heat sink 2 by means of an elastically yielding element 11, in practice an actual spring, acting between the heat sink 2 and the electronic component 1 so as to obtain the fastening of the latter on the heat sink 2 thanks to the spring-back of the spring 11.

Figure 2:
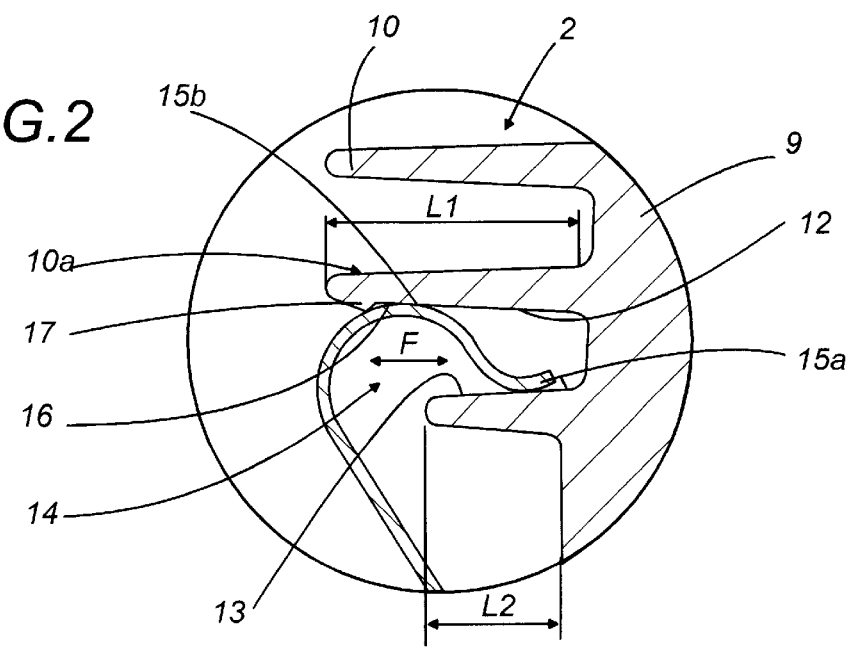
FIG. 2 shows a detail A as per FIG. 1 in enlarged scale.

As can also be seen in FIG. 2, at least one pair of the aforesaid fins 10a and 10b, contiguous to each other, presents a respective inner wall 12 and 13 opposite each other and so shaped as to define a compartment 14 for stably housing a portion 15 of the aforesaid elastically yielding element 11.

As can be seen in FIGS. 1 and 3, the pair of fins 10a and 10b in question is located, preferentially, in proximity to the aforesaid plane surface 6 in contact with the electronic component 1 to allow the use of a spring 11 of reduced size and thus more reliable in holding the electronic component 1.

On one of the aforesaid inner walls 12, 13 of the fins 10a and 10b (in the case of FIG. 2 it is the one indicated as 12 of the fin 10a) can be obtained an undercut 16 which defines a tooth 17 positioned in proximity to the free end of the fin 10a able to provide a blocking stop of the aforesaid portion 15 of the spring 11 within the compartment 14.

The spring 11, in turn, presents the clasping portion 15 which develops in such a way as to touch at least in one respective point each of the inner walls 12, 13 of the fins 10a and 10b, whereof one point normally coincides with the aforesaid tooth 17. The pairs of fins 10a and 10b may present an equal extension L starting from the central prolongation 9 (as in FIG. 3), or present different extensions L1 and L2, also starting from central prolongation 9; such extensions will clearly depend on the configuration of the heat sink 2 and on the configuration of the portion 15 of the spring 11.

The portion 15 of the spring 11 in the case of FIGS. 1 and 2 develops according to an arched profile in such a way as to rest with the free end 15a on the wall 13 and in proximity to the bottom of the compartment 14, whilst the central arched portion 15b is in contact with the aforesaid tooth 17 with which the wall 12 is provided.

This configuration of the portion 15 of the spring 11 allows a translation, of a few millimetres, of the portion itself within the compartment 14 (see arrow F in FIG. 2), i.e. its distance from the central prolongation 9, without impinging upon its fastening, but at the same time providing the possibility of varying the holding load of the portion 15c of the spring 11 on the electronic component 1 according to the size of the latter and to the needs noted at that moment on the spring itself or within the apparatus.

A heat sink thus structured, therefore, allows:

- the composition of electronic component—heat sink—spring sets of reduced size;
- high reliability of the overall structure of the heat sink since the heat sink itself maintains its structural characteristics;
- heat dissipation efficiency unchanged, or changed for the better, in comparison with prior art solutions, since the spring is housed between two fins with no need to work on or alter the structure of the heat sink.

The invention thus conceived can be subject to numerous modifications and variations, without thereby departing from the scope of the inventive concept. Moreover, all components may be replaced with technically equivalent elements.

What is claimed:

1. A heat sink (2) usable for electronic components (1), said heat sink (2) comprising:

a base portion (3) fitted with means (4) for coupling with a fixed support plane (5) of an apparatus;

a plane surface (6) positioned in proximity to said base portion (3) and in contact with a corresponding surface (7) of said electronic component (1);

a heat dissipation portion (8) comprising a central prolongation (9) of said base portion (3) from which a plurality of fins (10) project outwardly;

an elastically yielding element (11) being provided, acting between said heat sink (2) and said electronic component (1) in such a way as to exert a holding load on said electronic component (1) to allow the stable positioning of said surface (7) of the component relative to the plane surface (6) of said heat sink (2), wherein at least first and second (10a, 10b) of said fins (10), contiguous to each other, define respective inner walls (12, 13), such walls (12, 13) arranged in opposed facing relation and defining therebetween a compartment (14) for stably housing a first portion (15) of said elastically yielding element (11);

one of said inner walls (12) being provided with an undercut defining a tooth (17) positioned in proximity to a free end of said fin (10a) and defining a stop of said first portion (15) of the elastically yielding element (11) within the compartment (14);

the elastically yielding element (11) defined according to an arched profile in such a way as to rest with a free end (15a) of said first portion (15) on the other inner wall (13) of the compartment (14), and with a central arched portion (15b) of the first portion (15) in contact with the tooth (17) at a contact point;

wherein the holding load of the elastically yielding element (11) is selectively varied by translating said first portion (15) of said elastically yielding element (11) within the compartment (14) relative to said first and second fins (10a, 10b) such that a distance by which said first portion (15) is spaced from the central prolongation (9) is varied together with said contact point between said tooth (17) and said central arched portion (15b) of said first portion (15), thus altering said holding load of said elastically yielding element (11).

2. The heat sink according to claim 1, wherein said first and second fins (10a, 10b) are positioned in proximity to said plane surface (6) in contact with said electronic component (1).

3. The heat sink according to claim 1, wherein said elastic element (11) defines said first portion (15) so that said first portion (15) touches at least one respective point on each of said inner walls (12, 13) of said fins (10a, 10b).

4. The heat sink according to claim 1, wherein said first and second fins (10a, 10b) project outwardly an equal extension distance (L) from said central prolongation (9).

5. The heat sink according to claim 1, wherein said first and second fins (10a, 10b) project outwardly first and second different extension distances (L1, L2), respectively, from said central prolongation (9).

* * * * *